United States Patent
Caracciolo (10) Patent No.: US 9,620,223 B2
(45) Date of Patent: Apr. 11, 2017

(54) HIGH VOLTAGE REGULATOR

(71) Applicant: SK hynix Inc., Gyeonggi-do (KR)

(72) Inventor: Herve' Caracciolo, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/219,903

(22) Filed: Jul. 26, 2016

(65) Prior Publication Data
US 2017/0053702 A1    Feb. 23, 2017

(30) Foreign Application Priority Data
Aug. 20, 2015    (IT) .................. 102015000045673

(51) Int. Cl.
| G11C 5/14 | (2006.01) |
| G11C 16/12 | (2006.01) |
| G11C 16/30 | (2006.01) |
| G11C 7/14 | (2006.01) |

(52) U.S. Cl.
CPC .............. *G11C 16/12* (2013.01); *G11C 16/30* (2013.01); *G11C 7/14* (2013.01)

(58) Field of Classification Search
CPC .............................. G11C 7/14; G11C 11/4099
USPC .................................................. 365/226, 227
See application file for complete search history.

(56) References Cited

U.S. PATENT DOCUMENTS

2010/0295476 A1* 11/2010 Franco .................... G05F 1/561
                                                            315/297
2014/0167713 A1   6/2014 Choi
2016/0349777 A1* 12/2016 Caracciolo .............. G05F 1/575

OTHER PUBLICATIONS

Extended Search Report Issued by Italian Patent office on Apr. 12, 2016.
Cabrini, A. et al., High-Efficiency Regulated Charge Pump for Non-Volatile Memories, 2006, pp. 720-723, IEEE, Italy.

* cited by examiner

*Primary Examiner* — Han Yang
(74) *Attorney, Agent, or Firm* — IP & T Group LLP (57) ABSTRACT

Disclosed herein is a regulator for a non-volatile memory is provided. The regulator comprises an operational amplifier for receiving a reference voltage and a feedback voltage to output a voltage amplifying the difference of the reference voltage and the feedback voltage, the feedback voltage being obtained by dividing an output voltage of the regulator; a first switching unit turning on in response to the amplified voltage; a second switching unit electrically connected between a first node and the first switching unit for protecting the first switching unit from the voltage of the first node; and a third switching unit providing the output voltage of the regulator to a second node in response to a voltage of the first node.

13 Claims, 4 Drawing Sheets

HIGH VOLTAGE REGULATOR

CROSS-REFERENCE TO RELATED APPLICATION

The present application claims priority to Italian patent application No. 102015000045673 filed on Aug. 20, 2015, which is incorporated herein by reference in its entirety.

BACKGROUND

1. Field

The present disclosure relates generally to a high voltage regulator and, more particularly, to a high voltage regulator suitable for providing programming voltages to a nonvolatile memory.

2. Description of the Related Art

Among various types of flash memory devices, NAND-type flash memory devices are increasingly used as a high capacity data storage media. Each memory cell of a flash memory needs to be programmed to store information by trapping electrons in a floating gate of the memory cell. A programming operation is performed by driving a strong positive voltage onto a control gate of the memory cell to force a current to flow from a channel through the floating gate to the control gate. Usually, different programming voltages may be required, and a high voltage regulator may be used to provide the different programming voltages.

SUMMARY

Embodiments of the invention are directed to a high voltage regulator with improved matching from the first and second stages and reduced current consumption for providing programming voltages to a non-volatile memory, and including reduced compensation capacitor.

In an embodiment of the invention, a regulator for a non-volatile memory is provided. The regulator comprises an operational amplifier for receiving a reference voltage and a feedback voltage to output a voltage amplifying the difference of the reference voltage and the feedback voltage, the feedback voltage being obtained by dividing an output voltage of the regulator; a first switching unit turning on in response to the amplified voltage; a second switching unit electrically connected between a first node and the first switching unit for protecting the first switching unit from the voltage of the first node; and a third switching unit providing the output voltage of the regulator to a second node in response to a voltage of the first node.

The regulator may further comprise an active element. One terminal of the active load is electrically connected to the first node and the other terminal of the active load is provided with a voltage from a charge pump. The active load may comprise a plurality of high voltage p-type FET transistors connected with each other in series.

BRIEF DESCRIPTION OF THE DRAWINGS

The features and advantages of the present invention will become apparent from the following description of various embodiments of the present invention provided by way of non-limiting examples with reference to the annexed drawings, in which.

DETAILED DESCRIPTION

Various embodiments of the present invention will be described in detail below with reference to the accompanying drawings. It is noted, however, that while the present invention is described in connection with certain embodiments thereof, it will be apparent to those skilled in the art that various modifications can be made without departing from the spirit and scope of the invention.

It will be understood that, although the terms "first", "second" "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it Is will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein singular forms are intended to include the plural forms as well, unless the context clearly indicates otherwise. It will be further understood that the terms "comprises" "comprising" "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. However, it should be understood that the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
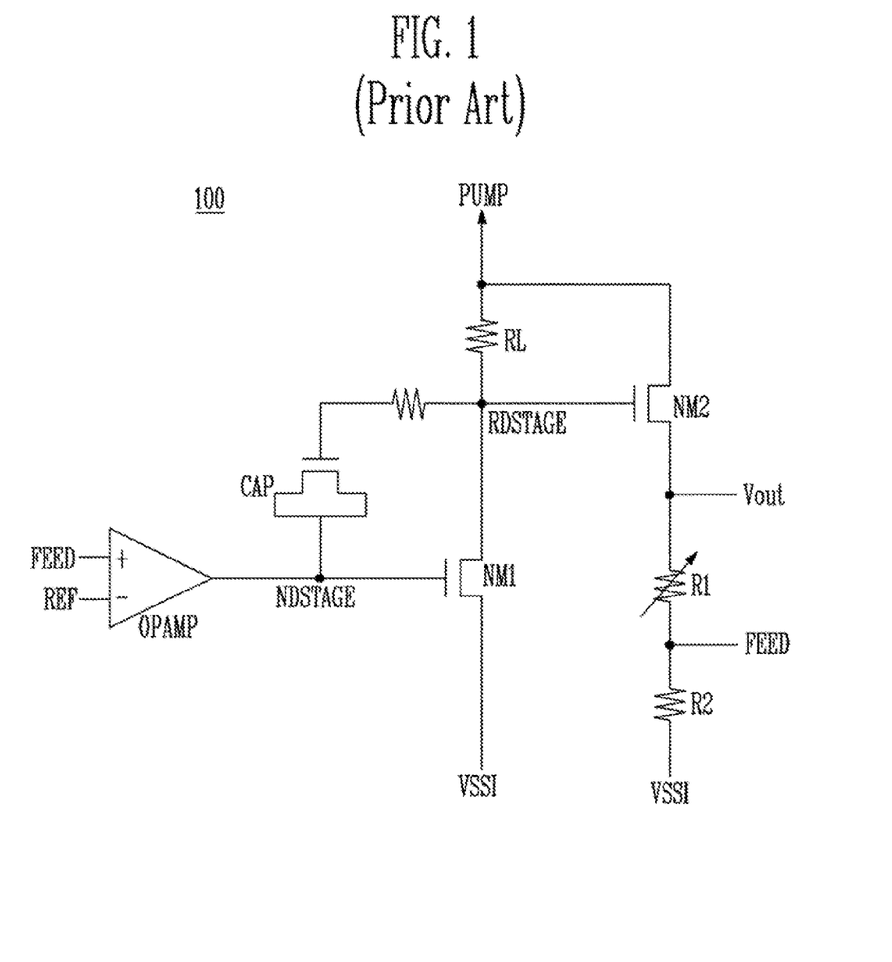
FIG. 1 is a schematic diagram illustrating a conventional high voltage regulator.

FIG. 1 illustrates a conventional high voltage regulator 100.

The regulator 100 comprises an operational amplifier OPAMP which receives a reference voltage REF and a feedback voltage FEED and outputs a voltage amplifying the difference of the reference voltage REF and the feedback voltage FEED. The regulator 100 further comprises a high voltage n-type FET transistor NM1. The gate of the transistor NM1 is electrically connected to the output of the operational amplifier OPAMP at a node NDSTAGE.

The source of the transistor NM1 is electrically connected to the ground voltage VSSI. The drain of the transistor NM1 is electrically coupled to a node RDSTAGE. Between the nodes NDSTAGE and RDSTAGE, there is a compensation capacitor CAP.

The regulator 100 further comprises a second n-type FET transistor NM2, The gate of the transistor NM2 is electrically connected to the node RDSTAGE. The drain of the transistor NM2 is coupled with a pumping voltage PUMP which is provided from a voltage pump, still indicated as "PUMP" The source node of the transistor NM2 is an output node of the regulator 100, and thus a source voltage of the transistor NM2 is an output voltage Vout of the regulator 100.

Moreover, the regulator 100 comprises a first resistor R1 and a second resistor R2. A first terminal of the first resistor R1 is electrically connected to the source of the transistor NM2 at the output node of the regulator 100, while a second terminal of the first resistor R1 is electrically connected to a first terminal of a second resistor R2. A second terminal of the second resistor R2 is electrically connected to a ground voltage VSSI. The feedback voltage FEED is a voltage between the first resistor R1 and the second resistor R2. In other words, the feedback voltage FEED is a voltage divided by a resistive network comprising the first resistor R1 and the second resistor R2. The first resistor R1 may be a variable resistor.

The regulator 100 further comprises a resistor RL between the pump node PUMP and the RDSTAGE node.

A 'high voltage' used for high voltage n-type FET transistor NM1 may have a range from about 5 volts to 24 volts during a programming step.

The regulater 100 may be functionally divided into a first stage, a second stage, and a third stage.

The first stage comprises the operational amplifier OPAMP. The operational amplifier OPAMP forms a feedback network receiving the reference and feedback voltages REF and FEED between the resistive network formed by first and second resistors R1 and R2. The first resistor R1 may be a variable resistor which allows to control the level of the output voltage Vout.

The second stage comprises the high voltage n-type FET transistor NM1 and a Miller compensation, i.e., the compensation capacitor CAP, Rc, between the first and second stages.

A source-follower or buffer having a gain of a value "1" is arranged at the output stage. The n-type FET transistor NM2 serves as the source-follower. The source follower is the stage which gives energy to the output node and regulates the desired output voltage through the adjustment of the resistive divider R1 and R2.

The feedback voltage FEED would be equal to the reference voltage REF when the loop is closed if the operational amplifier OPAMP were ideal. The node of the feedback voltage FEED between the resistors R1 and R2 is physically connected to the input of the operational amplifier OPAMP providing the feedback voltage FEED thereto.

For example, if the reference voltage REF is 1.25 volts, the feedback voltage FEED is brought to about 1.25 volts taking into account the non-ideality of the gain of the operational amplifier OPAMP.

In an ideal case, therefore, the inputs of the operational amplifier OPAMP are at the same voltage value, while in a non-ideal case, there is an offset between the two input nodes of the operational amplifier OPAMP. The output voltage Vout is given by "REF*(1+R1/R2)," i.e., the ratio between the resistances of the first and second resistors R1 and R2 connected to the node of the feedback voltage FEED.

This occurs when the feedback loop has a sufficiently high gain and therefore the feedback voltage FEED is 1.25 i.e., equal to the reference voltage REF. In this case, the ratio between the reference voltage and the output voltage (i.e., REF/Vout) is given by "R2/(R1+R2)" and the current flowing in R2 is equal to the current flowing in R1.

The pumping voltage PUMP supplied by the charge pump depends on the regulator 100. For example, if the output voltage Vout increases to 24 volts, the pumping voltage PUMP goes to 29 Volts.

This conventional configuration has several limitations. The first limitation relates to the fact that the operational amplifier OPAMP includes low voltage transistors while the transistor NM1 of the second stage is a high voltage transistor. High voltage transistor NM1 is used to ensure that the node RDSTAGE reach the high values in programming. The first problem then is that the first and second stages cannot be matched. In other words, this structure suffers from a mismatch arising from the different intrinsic structures of the two transistors, that is, an output transistor of the operational amplifier OPAMP having a low voltage and the high voltage n-type FET transistor NM1 having a high voltage.

A further problem of the conventional configuration of FIG. 1 is that it requires a rather large compensation between the first and second stages. In fact, the capacitance CAP between the gate and drain of the transistor NM1 of the second stage involves a strong Miller effect, such capacity being further multiplied by the gain of the second stage. Here, "NDSTAGE" indicates the second stage while "RDSTAGE" indicates the third stage.

Another major problem of the conventional regulator 100 is that the current of the second stage, i.e., the current that is taken from the pumping voltage PUMP, depends strongly on the resistance RL.

More particularly, the voltage of the node RDSTAGE is equal to the sum of an output voltage Vout and the threshold voltage of the transistor NM2 of the third stage, and as such it could be fixed and cannot change.

In reality, however, the resistance RL shows strong variations with temperature and process variation. Hence, the current, from the charge pump PUMP, may vary widely depending upon such thermal and process drifts.

It is also noted, that a typical memory device may include at least a dozen conventional regulators of this type As a result current consumption fluctuations may be large and not controllable and therefore have to be compensated.

Additionally, the conventional regulator 100 has a dominant pole given by the operation of the first stage (i.e., the operational amplifier OPAMP) because a corresponding Rout of the first stage will be higher than an output resistance of the second stage. The pole is therefore given by the output resistance multiplied by the capacity as seen in the second stage.

Figure 2:
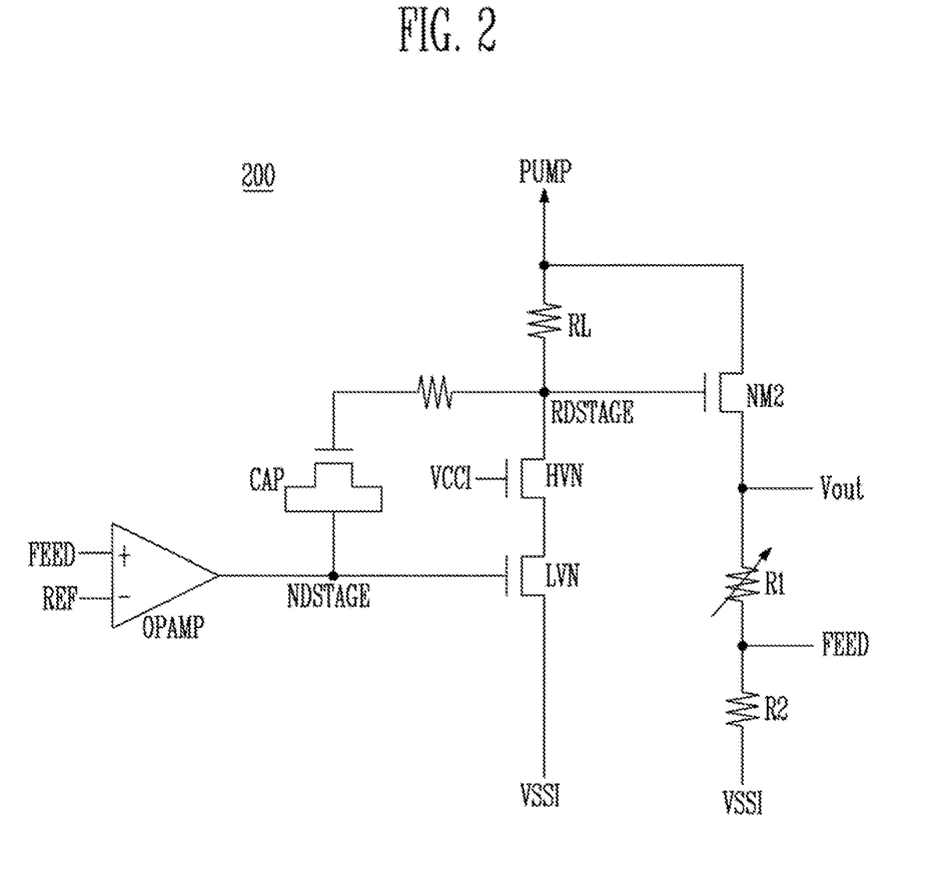
FIG. 2 is a schematic diagram illustrating a high voltage regulator, according to an embodiment of the present invention.

Referring now to FIG. 2 a high voltage regulator 200 is provided, according to an embodiment of the present invention.

The regulator 200 comprises an operational amplifier OPAMP, a low voltage n-type FET transistor LVN, a high voltage n-type FET transistor HVN, an n-type FET transistor NM2, a first resistor R1 and a second resistor R2.

The operational amplifier OPAMP is arranged to receive a reference voltage REF and a feedback voltage FEED to output a voltage amplifying the difference of the reference voltage REF and the feedback voltage FEED. The low voltage n-type FET transistor LVN has a gate which is electrically connected to the output of the operational amplifier OPAMP at a node NDSTAGE. The low voltage n-type FET transistor LVN may turn on or turn off in response to a voltage of the node NDSTAGE.

The high voltage n-type FET transistor HVN is electrically connected between a node RDSTAGE and the low voltage n-type FET transistor LVN. The high voltage n-type FET transistor HVN has a source electrically connected to the drain of the low voltage n-type FET LVN. The low and high n-type FET transistors HVN and LVN form a cascade connection. A bias voltage VCCI is provided to the gate of the high voltage n-type FET transistor HVN.

The n-type FET transistor NM2 has a gate electrically connected to the drain of the high voltage n-type FET transistor HVN at a node RDSTAGE. The source node of the transistor NM2 is an output node of the regulator 200, and thus a source voltage of the n-type FET transistor NM2 is an output voltage Vout of the regulator 200.

The first resistor R1 has a first terminal electrically connected to the source of the n-type FET transistor NM2 at the output node of the regulator 200. The second resistor R2 has a first terminal electrically connected to the second terminal of the first resistor R1. The second terminal of the second resistor R2 is electrically connected to a ground voltage VSSI.

The feedback voltage FEED is a voltage between the first resistor R1 and the second resistor R2. In other words, the feedback voltage FEED is a voltage divided by a resistive network comprising the first resistor R1 and the second resistor R2. The resistor R1 may be a variable resistor which allows to control the level of the output voltage Vout. The resistor R2 may be a variable resistor.

The operational amplifier OPAMP is arranged to receive the reference voltage REF on its inverting input and the feedback voltage FEED on its non-inverting input. The drain of the n-type FET transistor NM2 is provided with a pumping voltage PUMP from a charge pump. The n-type FET transistor NM2 provides a voltage from the charge pump to the output Vout of the regulator 200 in response to the voltage of the node RDSTAGE.

The low voltage n-type FET transistor LVN can be chosen such that it is matched with an output transistor of the operational amplifier OPAMP.

The regulator 200 further comprises a compensation capacitor CAP. One terminal of the capacitor CAP is electrically coupled with the gate of the low voltage n-type FET transistor LVN at the node NDSTAGE. The other terminal of the capacitor CAP is electrically coupled with the drain of the high voltage n-type FET transistor HVN, It is worth noting that the aforementioned first problem associated with the conventional regulator 100, i.e., a mismatch caused by the difference of an output transistor of the operational amplifier OPAMP and the high voltage n-type FET transistor NM1, is thus solved, by using the low voltage n-type FET transistor LVN. In fact, the element giving the gain, i.e., the low voltage n-type FET transistor LVN, can now be matched with the output transistors of the operational amplifier OPAMP.

In order to use the low voltage n-type FET transistor LVN, however, it should be protected, because a low voltage FET cannot endure high voltage values between its source and drain. In fact, if the node RDSTAGE were to reach a high voltage value, the low voltage n-type FET transistor LVN would be damaged.

This problem is prevented by employing the high voltage n-type FET transistor HVN having its gate connected to the VCCI voltage thereby obtaining a cascode voltage protection for the low voltage n-type FET transistor LVN. In other words, the high voltage n-type FET transistor HVN is a cascode transistor for protecting the low voltage n-type FET transistor LVN.

The use of the cascode connection allows reducing the Miller effect on the second stage, thus also reducing the compensation capacity CAP. The gain now seen from the node NDSTAGE towards the node RDSTAGE equal to or less than the ratio of the gain of the low and high voltage n-type FET transistors LVN and HVN. The decrease in the compensation capacity CAP allows to reduce an area occupied by the compensation capacitor CAP. Even though some area is occupied by the transistor HVN, the overall area occupied by the compensation capacitor CAP is reduced because the area reduction due to smaller capacitor CAP is more influential.

Thus, instead of employing a high voltage transistor NM1 as in the conventional regulator 100, regulator 200 employs two transistors LVN and HVN with different characteristics. Regulator 200 employs a cascode connection of the low voltage n-type FET transistor LVN, which has the same characteristics of the output stage of the operational amplifier OPAMP, and the high voltage n-type FET transistor HVN, which protects the low voltage n-type FET LVN. This cascode connection has the advantage of obtaining a reduction in the Miller effect of the second stage as well as providing improved match with the output transistors of the operational amplifier OPAMP.

Figure 3:
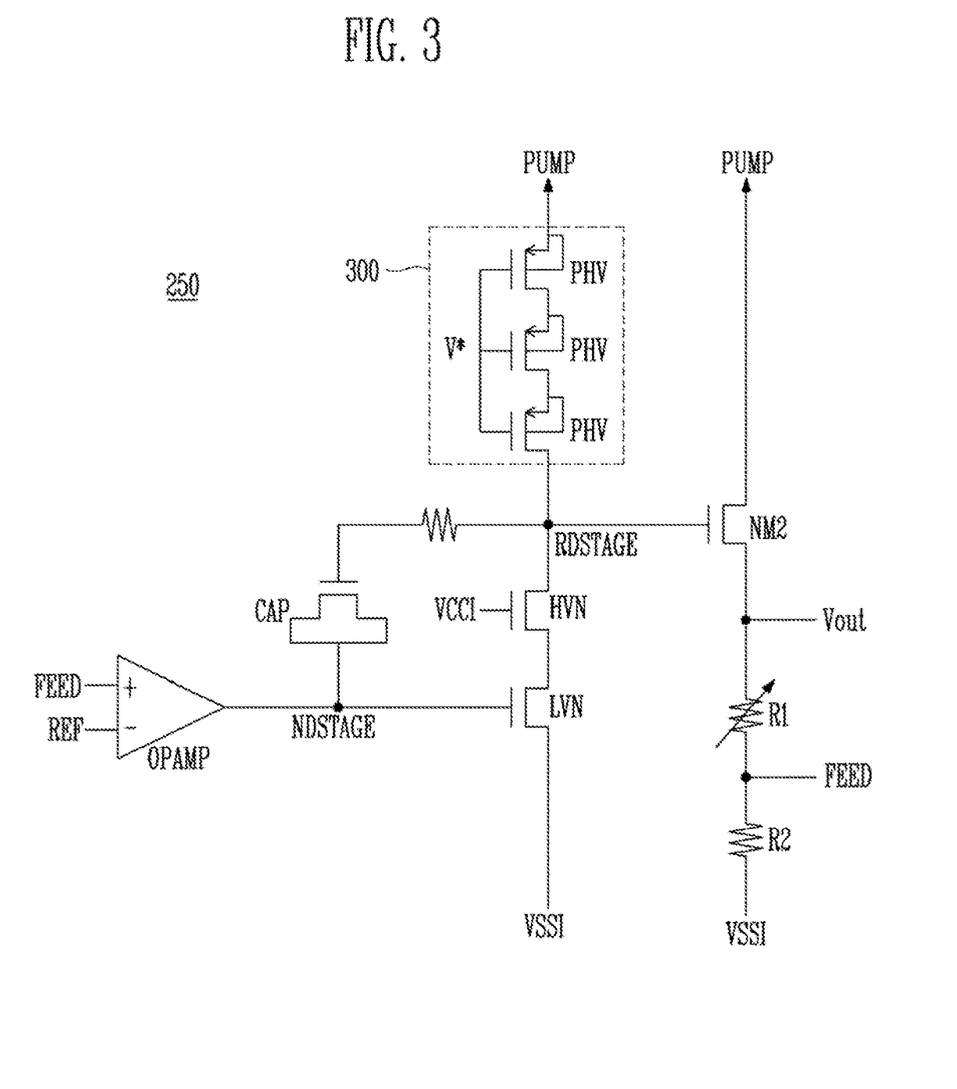
FIG. 3 is a schematic diagram illustrating a high voltage regulator according to another embodiment of the present invention.
Figure 4A:
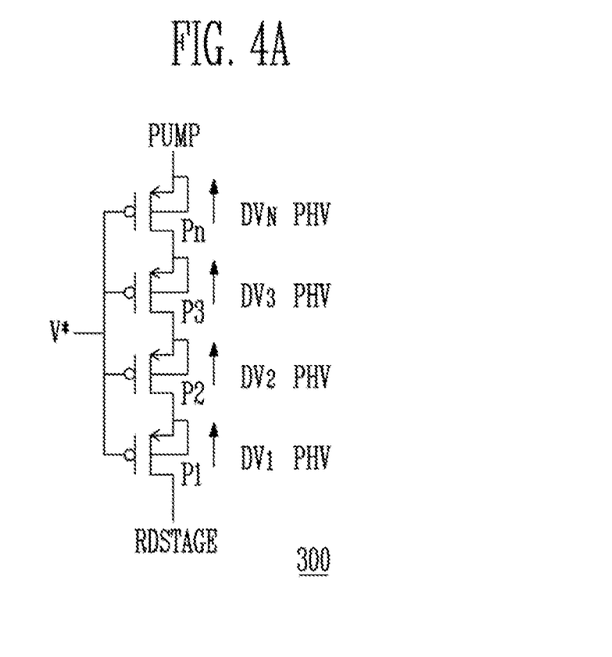
FIG. 4A is a schematic diagram illustrating one example of a connection arrangement of an active load of FIG. 3.

FIG. 3 illustrates a high voltage regulator 250 according to another embodiment of the present invention. FIG. 4A illustrates an example of the connection arrangement of the active element 300 of FIG. 3

A difference between the embodiments of FIGS. 2 and 3 is that the high voltage regulator 250 of FIG. 3 further comprises an active load 300. One terminal of the active load 300 is electrically connected to the drain of the high voltage n-type FET transistor HVN at the node RDSTAGE. The other terminal of the active load 300 is provided with a voltage from the charge pump PUMP. The active element 300 may comprise a plurality of high voltage p-type FET transistors PHV connected with each other in series. The gates of the plurality of high voltage p-type FET transistors PHVs may be provided with a first bias voltage V*.

In the embodiment of FIG. 3 three high voltage p-type FET transistors PHV are illustrated as an example. The number of the plurality of high voltage p-type FET transistors PHVs is determined so that the maximum voltage between the source and the drain of each high voltage p-type FET transistor PHV does not exceed a threshold voltage which the high voltage p-type FET transistor PHV can tolerate.

Another technical problem of the prior art regulator 100 is that the resistance RL in FIG. 1 widely varies for thermal and process drifts, thereby leading to a stable non-consumption of the pumping voltage PUMP, which cannot be controlled.

To solve this problem, the series of resistances, i.e., passive elements of the known solution is substituted with a series of active elements 300, in particular of high voltage p-type FET transistors PHVs that have their gates connected in common to the same first bias voltage V*. An advantage of using the series of high voltage p-type FET transistors PHVs consists in realizing a self-regulated resistance that linearizes the current consumption of the charge pump PUMP with respect to the regulated output voltage Vout.

For example, in the prior art regulator 100 of FIG. 1, it can be assumed that the pump voltage PUMP is equal to 30V, the output voltage Vout is 15V, the threshold voltage Vth between the gate and the source of the n-type FET transistor NM2 is 1 V. When the node RDSTAGE is stable, even when the regulator 100 is stable and adjusted, it leads to a voltage that is higher than the output voltage Vout for a threshold voltage value Vth of the transistor NM2 connected to the output node Vout The node RDSTAGE is at 16 V (Vout+Vth=15V+1V) and a voltage of the resistance RL connected between the node RDSTAGE and the pumping voltage PUMP is equal to 14 volts (PUMP−RDSTAGE=30V−16V). When the regulator 200 of FIG. 2 should regulate the output voltage Vout, for example, at 25 volts, the node RDSTAGE is at 26 volts (Vout+Vth=25V+1V) and a voltage of the resistance RL connected between the node RDSTAGE and the pumping voltage PUMP is equal to 4 volts.

In essence, by using resistors, i.e., the passive elements the consumption of the charge pump PUMP providing the current, is linked to the value of the output voltage Vout to be adjusted, and then an output code of the memory device which receives the adjusted output voltage Vout. In particular, the lower the output voltage Vout is, the more current the regulator consumes, because the voltage on the resistance RL is higher. This is a big problem especially because the memory devices typically have many regulators. For example, a conventional memory device may have ten regulators in parallel, Attempting to turn them on all together at once causes a very large spike in the current consumption.

Regulator 250, resolves this problem associated with the prior art by using the active elements 300. Let us assume, for example, that the active element 300 comprises four high voltage p-type FET transistors PHVs that the pumping voltage PUMP is still 30 volts and, that, as previously, the node RDSTAGE is at 16 volts. The active elements 300 of the high voltage p-type FET transistors PHVs therefore have a total voltage of 14 volts as before.

The high voltage p-type FET transistors PHVs have however the intrinsic resistances and then the voltage of each high voltage p-type FET transistor PHV. Assuming that these resistances are all equal, even though clearly they are not all equal each high voltage p-type FET transistor PHV will have 3.5V (=14V/4), It occurs that the voltage on the different high voltage p-type FET transistors PHVs varies depending on the node RDSTAGE while the first bias voltage V* is fixed, in particular 2V.

Considering now the previously analyzed cases, it can be verified that, with the output voltage Vout to be regulated being equal, for example, to 15V the first high voltage p-type FET transistor P1 in FIG. 4A has a gate-source voltage VGS equal to V*+$V_{RDSTAGE}$+ΔV.

To calculate the gate-source voltage VGS of the first high voltage p-type FET transistor P1 with real value, it equals to 21.5 V, derived by 2V (=the first bias voltage V*)+16V (=$V_{RDSTAGE}$=Vout+the threshold voltage value Vth of the transistor NM2 connected to the output node Vout=15V+1V)+3.5V (ΔV=(PUMP−$V_{RDSTAGE}$)/number of the high voltage p-type FET transistors PHVs=14V (=30V−16V)/4). In the case where the output voltage Vout to be controlled is equal to 25V, the voltage of the node RDSTAGE is at 26V and then the voltage of the active load 300 (=PUMP−$V_{RDSTAGE}$) is equal to 4V leading to each high voltage p-type FET transistor PHV having 1V. It then occurs that the gate-source voltage VGS of the high voltage p-type FET transistor P1 is 2V (=the first bias voltage V*) +26V (=$V_{RDSTAGE}$=Vout+the threshold voltage value Vth of the transistor NM2 connected to the output node Vout=25V+1V)+1V (ΔV=(PUMP−$V_{RDSTAGE}$)/number of the high voltage p-type FET transistors PHVs=4V (=30V−26V)/4), i.e., 29V.

Thus, the present invention provides a self-adaptive regulator, in which the feedback modulates the resistance of the active element 300 as a function of the output voltage Vout. In particular, when the voltage difference between the pump voltage PUMP and the node RDSTAGE is large, the equivalent resistance of the transistor series of the active element 300 increases, whereas when the voltage difference is smaller, the equivalent resistance of the transistor series of the active element 300 decreases.

In this way, the regulator 250 no longer suffers from drift and current consumption is no longer dependent on the output voltage Vout but the regulator 250 virtually and automatically smooths this level.

The resistance of each high voltage p-type FET transistor PHV can be calculated according to the following formula.

$$R_{On1} = \frac{1}{\mu C_{ox} \frac{W}{L} \left( \left| V^* - V_{RDSTAGE} - \left( \frac{V_{PUMP} - V_{RDSTAGE}}{N} \right) \right| - |V_{TH}| \right)} \propto$$

$$\frac{1}{\left| V^* - \frac{V_{PUMP}}{N} - V_{RDSTAGE} \left( 1 - \frac{1}{N} \right) \right| - |V_{TH}|}$$

The equivalent total resistance of the active load 300 can be calculated by the following formula.

$$R_{TOT} = \sum_{n=1}^{N} R_{on_n}$$

In the design phase, it is also necessary that the bias current of one stage which includes a series of transistors is given by the resistance, and therefore by the W/L ratio of these transistors and also the bias voltage V* has to be optimized for have the correct bias current of the second stage.

As to the number N of transistors included in the active element 300, it should be first ensured that these transistors cannot be destroyed in the operation of the regulator (SOA limits). A sufficient number of transistors are to be provided in order to ensure that the maximum value of voltage of the respective N transistors that each transistor can support between drain and source is not overcome. For example, if the maximum drain-source voltage VDS of each transistor is 10V, knowing that the voltage of the respective N transistors between the charge pump PUMP and the node RDSTAGE can be 14V, only one transistor cannot be used, but at least two are to be provided, so that each should sustain 7 volts at the maximum (i.e., less than the maximum value of 10V).

It should be remarked that it is well known that the high voltage p-type FET transistors are not as robust as the high voltage n-type FET transistors, at least in the memory technology. While the high voltage n-type FET transistors can go up to 30 volts, the voltages between drain and source of the high voltage p-type FET transistors are lower, approximately 10 volts. However, the p-type FET transistors are preferred in this case because they can be turned on in an easier way due to the different transistor polarization with respect to n-type FET transistors. In particular, when the high voltage n-type FET transistors are used, the first bias voltage V* should be higher than the voltage at the node RDSTAGE to turn on the transistors; however, this latter voltage value is variable during the operation, thus complicating the choice of the value of first bias voltage V*.

The SOA limit may therefore be used as a first requirement to be met for determining the number N of high voltage p-type FET transistors to be used.

Another consideration may be the total value of resistance to be obtained. Generally, when more transistors are employed, the resistance will increase and the current of the voltage pump will decrease. The maximum number of transistors however may be limited for ensuring the turning on of the transistors.

More particularly, the number N of the high voltage p-type FET transistors PHVs may be chosen so as to have a correct polarization of the second stage. In particular, the following conditions may be met.

First, when the voltage of the node RDSTAGE has reached a maximum value (i.e., when the controller output has also reached its maximum value), the current in the second stage should be minimum;

Second, when the output voltage Vout is at its minimum value (corresponding to the minimum regulation action), the current in the second stage should be maximum. The current in the second stage may be calculated according to the following equation:

$$I=(PUMP-V_{RDSTAGE})/Rtot,$$

wherein Rtot represents the equivalent total resistance of the active load 300. Third, the number N of high voltage p-type FET transistors PHVs also affects the voltage on each high voltage p-type FET transistors PHV which should always ensure that an absolute value (|VDS|) of the drain-source voltage VDS of each high voltage p-type FET transistors PHV is less than the breaking voltage of the high voltage p-type FET transistor PHV, thus fixing a lower limit for the number N (the more is N, the more Rtot increases).

It should be however remarked that the effect of self-compensation of the current is particularly advantageous when compared to the use of the passive resistances, and is always obtained regardless of the number and size of the high voltage p-type FET transistors PHVs and of the value of the biasing voltage V*.

The terms high voltage transistors and low voltage transistors may be defined based on the following limits, but the range is not necessarily limited thereto.

HV: VGBODY≤30V; VDS (N)≤30V, VGS (P)≤10V

LV: VGBODY≤5V; VDS (N)≤4-5V, VGS (P)≤4-5V where VDS (N) represents the drain-source voltage of each high voltage n-type FET transistor, and VGS (P) represents the gate-source voltage of each high voltage p-type FET transistor.

In FIG. 4A, sources of the previous-staged high voltage p-type FET transistors PHVs are coupled with bulks of the next-staged high voltage p-type FET transistors PHVs respectively in the active load 300.

In particular, the connection of the bulk of the next-staged p-type FET transistors PHVs to the source of the previous-staged high voltage p-type FET transistors PHVs prevents the breakage of the source-bulk junction if the charge pump PUMP provides a voltage value close to the critical limit of the high voltage p-type FET transistors PHVs.

Figure 4B:
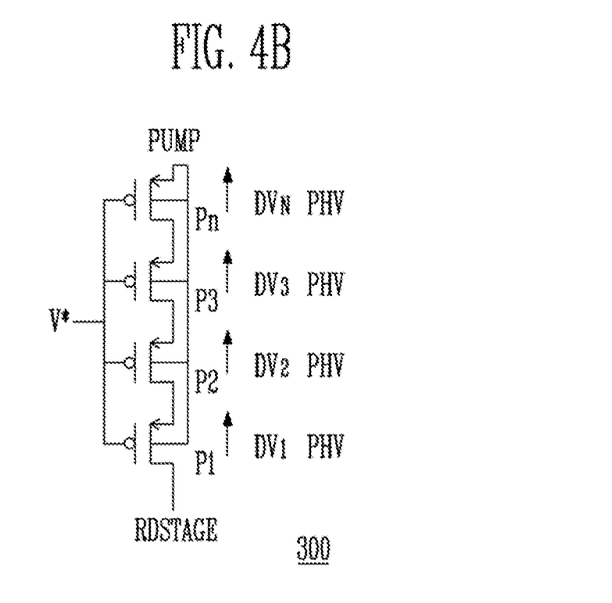
FIG. 4B is a schematic diagram illustrating another example of a connection arrangement of the active load of FIG. 3.

FIG. 4B is a schematic diagram illustrating another example of the connection arrangement of the active load 300 of FIG. 3. In FIG. 4B, a bulk of at least one of the high voltage p-type FET transistors PHVs is coupled with a source of the topmost high voltage p-type FET transistor.

In this case, the connection of the bulk of the p-type FET transistors PHVs to the charge pump PUMP is made only if the pump voltage PUMP does not exceed the breakage limit value of an absolute value (|VBS|) of the bulk-source voltage VBS of each high voltage p-type FET transistor. This alternative arrangement allows reducing the occupied area of the active load 300 since the high voltage p-type FET transistors PHVs share a same well.

It should be also remarked that the first bias voltage V* can be varied to provide a trimming of the total resistance Rtot of the high voltage p-type FET transistors PHVs, thereby adding a further degree of freedom for the optimization of the consumption of the second stage with respect to the process spread.

With the aforementioned high voltage regulator, the mismatch between the output transistor of the first stage (i.e., the operational amplifier OPAMP) and the high voltage transistor is overcome by using a low voltage transistor LVN at the output of the operational amplifier OPAMP. Moreover, due to the cascode connection of the low and high voltage transistors LVN and HVN the compensation capacitance CAP between the nodes RDSTAGE and NDSTAGE can be drastically reduced, which results in reduction of the area occupied by the compensation capacitor CAP. The current provided from the charge pump PUMP can also be stabilized by using the active element 300 between the node RDSTAGE and the pump voltage PUMP, In essence, the aforementioned high voltage regulator allows to increase the matching between low voltage gain stage and high voltage one, and to reduce the pump current consumption, thereby increasing rejection of the spreads over skew, temperature and operating voltage range.

Moreover, such a regulator is able to adapt during operation the current consumption and to trim the second stage load resistance, and to obtain a higher DC gain enhancing the second stage resistance.

Substitution of the passive resistances of the prior art regulator 100 with p-type transistors allows obtaining a more stable current consumption from the charge pump (over model, PVT, and regulator output) and reducing the overall current consumption; in this way, the charge pump specifications could be relaxed and a current saving in the order of 1-2 mA is possible considering pump efficiency and the total number of used regulator in a flash memory device.

In particular, the resistance is self-modulated by the output voltage, and the mismatches of the transistors PHV are less than resistors.

From the foregoing it will be appreciated that, although specific embodiments of the invention have been described herein for purposes of illustration, various modifications may be made without deviating from the spirit and scope of the invention as defined by the appended claims.

What is claimed is:

1. A regulator for a non-volatile memory comprising:
an operational amplifier suitable for receiving a reference voltage and a feedback voltage to output a voltage amplified by the difference of the reference voltage and the feedback voltage, the feedback voltage being obtained by dividing an output voltage of the regulator;
a first switching unit operable according to the amplified voltage;
a second switching unit electrically connected between a first node and the first switching unit, and suitable for protecting the first switching unit from a voltage of the first node; and
a third switching unit suitable for providing the output voltage of the regulator to a second node in response to the voltage of the first node.

2. The regulator according to claim 1,
wherein the first switching unit includes a low voltage n-type FET, the gate of which is electrically connected to an output of the operational amplifier,
wherein the second switching unit includes a high voltage n-type FET the source of which is electrically connected to the drain of the low voltage n-type FET, and the drain of which is electrically connected to the first node, and
wherein the third switching unit includes an n-type FET whose gate is electrically connected to the first node, and whose source is electrically connected to the second node.

3. The regulator according to claim 2, wherein the low voltage n-type FET is matched with an output transistor of the operational amplifier.

4. The regulator according to claim 1, further comprising:
to a first resistor, one terminal of which is electrically connected to the second node; and
a second resistor, one terminal of which is electrically connected to the other terminal of the first resistor, and the other terminal of which is electrically connected to a ground voltage,
wherein the feedback voltage is a voltage between the first resistor and the second resistor.

5. The regulator according to claim 1, wherein the operational amplifier receives the reference voltage on its inverting input and the feedback voltage on its non-inverting input.

6. The regulator according to claim 1,
further comprising an active load,
wherein one terminal of the active load is electrically connected to the first node and the other terminal of the active load is provided with a voltage from a charge pump.

7. The regulator according to claim 6, wherein the third switching unit provides the voltage from the charge pump to the second node as the output voltage of the regulator in response to the voltage of the first node.

8. The regulator according to claim 6, wherein the active load comprises a plurality of high voltage p-type FETs connected with each other in series.

9. The regulator according to claim 8, wherein the gates of the plurality of high voltage p-type FETs are provided with a first bias voltage.

10. The regulator according to claim 9, wherein the number of the plurality of high voltage p-type FETs is determined such that the maximum voltage between the source and the drain of the respective high voltage p-type FETs does not exceed a threshold voltage which the high voltage p-type FET can tolerate.

11. The regulator according to claim 9, wherein a source of a previous-staged high voltage p-type FET is coupled with a bulk of a next-staged high voltage p-type FET, respectively, in the active load.

12. The regulator according to claim 9, wherein a bulk of at least one of the high voltage p-type FETs is coupled with a source of the topmost high voltage p-type FET in the active load.

13. The regulator according to claim 1,
further comprising a capacitor,
wherein one terminal of the capacitor is electrically coupled with an output of the operational amplifier, and the other terminal of the capacitor is electrically coupled with the first node.

* * * * *